United States Patent [19]

Yamakawa et al.

[11] Patent Number: 5,229,549
[45] Date of Patent: Jul. 20, 1993

[54] CERAMIC CIRCUIT BOARD AND A METHOD OF MANUFACTURING THE CERAMIC CIRCUIT BOARD

[75] Inventors: Akira Yamakawa; Mitsuo Osada; Nobuo Ogasa, all of Hyogo, Japan

[73] Assignee: Sumitomo Electric Industries, Ltd., Osaka, Japan

[21] Appl. No.: 753,928

[22] Filed: Sep. 3, 1991

Related U.S. Application Data

[63] Continuation-in-part of Ser. No. 609,890, Nov. 6, 1990.

[30] Foreign Application Priority Data

Nov. 13, 1989 [JP] Japan .................................. 1-294228

[51] Int. Cl.$^5$ ............................................. H05K 1/00
[52] U.S. Cl. ...................... 174/262; 174/258; 174/264; 428/901
[58] Field of Search ............... 174/250, 255, 256, 258, 174/262, 264, 265; 428/901; 29/852

[56] References Cited

U.S. PATENT DOCUMENTS 4,323,593  4/1982  Tsunashima .
4,684,446  8/1987  Charles et al. .
4,732,780  3/1988  Mitoff et al. .
4,861,641  8/1989  Foster et al. .

FOREIGN PATENT DOCUMENTS 63-64918  12/1988  Japan .

OTHER PUBLICATIONS

Patent Abstracts of Japan, vol. 13, No. 486 (E-840) [3834] Nov. 6, 1989 (Hata).

*Primary Examiner*—Leo P. Picard
*Assistant Examiner*—Cheryl R. Figlin
*Attorney, Agent, or Firm*—W. G. Fasse

[57] ABSTRACT

A ceramic electrically insulating circuit board (1) has an electrically conductive plug (4a) tightly filling a through-hole (2) formed in the circuit board (1) made of aluminum nitride including a low, up to 1% by weight at the most, content of an oxide phase as a sintering assistant. The conductive plug is formed by putting high melting point metal paste (10) into the through-hole and sintering either the board prior to the metal paste or sintering both, the board and the paste, simultaneously. Then, causing melted copper or copper alloy (11) to permeate into gaps or interstices in the sintered high-melting point metal plug to form a tight seal of the hole and good electrical contacts of the conductive plug and any circuits on both sides of the board.

4 Claims, 2 Drawing Sheets

CERAMIC CIRCUIT BOARD AND A METHOD OF MANUFACTURING THE CERAMIC CIRCUIT BOARD

CROSS-REFERENCE TO RELATED APPLICATION

The present application is a continuation-in-part application of our copending application U.S. Ser. No. 07/609,890. filed on Nov. 6, 1990.

FIELD OF THE INVENTION

The present invention relates to an electrically insulating ceramic circuit board comprising a conductive portion capable of electrically connecting circuits formed on front and rear surfaces of such a circuit board. The invention also relates to a method of manufacturing such a circuit board.

BACKGROUND INFORMATION

Recently, there have been increasingly strong demands for electronic devices having ever smaller sizes and high reliabilities. In order to meet such demands, methods of mounting integrated circuits have been developed from methods of mounting IC packages on printed circuit boards as in the prior art to methods of patterning a conductor layer, resistors or the like mainly in a structure on a surface of an insulating board of ceramics for example, or directly mounting an IC chip on a board surface and hermetically sealing it.

In addition, according to demands for large scale integration or multiple function circuits, circuit boards have been made heretofore having circuits not only on the front surface of an insulating board but also on the rear surface thereof and including electrical connections of the circuits on the front and rear surfaces of the board, by means of through-holes formed in the board for passing electrical conductors therethrough. In such a circuit board having circuits on both the front and rear surfaces of an insulating board, which are electrically connected, it is particularly required of plug elements in through-holes formed in the board that:

a. the electrical connections between the circuits formed on the front the rear surfaces of the board, are achieved with sufficient certainty, and that b. a sufficient airtightness be maintained so as not to lose the airtightness by means of the through-holes in the case where the circuit formed on either surface of the board must be hermetically sealed.

Conventionally, a method shown in FIG. 4 is used for forming conductive plug elements in through-holes formed in a board. The known method includes: forming prescribed through-holes 2 in an insulating board 1, squeezing metal paste 4 into the through-holes 2 using a rubber squeegee 3, and drying and sintering the metal paste in the through-holes 2, thereby forming metallic conductive plug elements in the through-holes 2. Then, as shown at A in FIG. 5, conductor patterns 5, 6 are formed on upper and lower surfaces of the conductive plug elements 4a filling the through-holes 2 of the insulating board 1, whereby the circuits on the front and rear surfaces of the insulating board 1 are electrically interconnected.

However, it is difficult to apply the above mentioned method where the through-holes are completely filled as shown at A in FIG. 5, since defects as described below often occur. For example, as shown at B in FIG. 5, a gap may be formed in a through-hole to cause a defective connection between the conductor pattern 5 on the upper surface of the board and the conductor pattern 6 on the lower surface thereof, or as shown at C in FIG. 5, the conductor pattern 5 on the upper surface and the conductor pattern 6 on the lower surface of the board are connected by a conductive portion 4a which does not fill the through-hole 2 resulting in a leaking connection. Thus, this method cannot completely satisfy the above mentioned requirements for the conductive plug element 4a in the through-holes 2, namely that a complete electric connection and a sufficient airtightness are assured.

There is another known method as shown in FIG. 6 and disclosed in Japanese Patent Publication No. 63-64918, wherein first prescribed through-holes 2 are formed in an insulating board 1. Next, a conductor pattern 6 is formed on the rear or lower surface of the board 1 to cover one opening of each through-hole 2. Then, a metallic wire 7 having a diameter slightly smaller than the inner diameter of each through-hole 2 and a length slightly shorter than the depth of each through-hole 2, is inserted into each through-hole 2 from the other open side. After that, a conductor pattern 5 is formed on the top of each metallic wire 7 to seal the other side of each through-hole 2.

However, this method also has a disadvantage in maintaining the desired airtightness of the through-holes 2. More specifically, the airtightness is maintained only by the conductor patterns 5, 6 formed on the upper and lower openings of the through-holes 2 and a gap unavoidably exists between the corresponding metallic wire 7 and the inner wall surface of the through-hole 2. Accordingly, if a small gap or crack occurs in the conductor patterns 5, 6 the airtightness is lost thereby. In addition, it is difficult to automate the work of inserting the metallic wires 7 into the through-holes 2, whereby the manufacturing efficiency is not good.

U.S Pat. No. 4,732,780 (Mitoff et al.) discloses a process for producing a hermetic feedthrough in a ceramic substrate by providing a sheet of liquid phase sinterable ceramic composition having a feedthrough hole, filling the feedthrough hole with refractory metal metallization material, firing the resulting structure to produce a sintered substrate and adherent metallization. The metallization includes continuous phases of refractory metal and glass. The refractory metal is contacted with electrically conductive intrusion metal and the resulting structure is heated to a temperature at which the glassy phase is fluid, the refractory metal is solid, and the intrusion metal is liquid whereby the liquid metal preferentially wets the refractory metal, migrates into the metallization displacing glass and, upon subsequent solidification, partially or wholly occupies the volume space originally containing the continuous glass phase.

U.S. Pat. No. 4,323,593 (Tsunashima) discloses a method of applying a paste through a hole in a printed circuit board. A mask is provided with a hole with an upper larger cross-section portion and a lower smaller cross-section portion, the junction between the portions forming a ring-shaped land. The lower hole portion has a cross-section larger than the cross-section of the hole in the printed circuit board. The printed circuit board is positioned adjacent the mask with the hole therein aligned with the hole in the mask, and paste is applied to the hole in the mask from the upper hole portion. This paste is pressed through the hole in the mask and fills the hole in the circuit board with paste and coats the surface of the circuit board which is toward the mask and/or the surface which is away from the mask in the area around and close to the hole with the paste.

SUMMARY OF THE INVENTION

It is an object of the present invention to provide a ceramic circuit board including board penetrating conductive plug elements assuring a good electrical connection between the conductive plug elements and circuit conductors on both surfaces of the board and simultaneously providing the required airtightness to prevent leaks through the board.

Another object of the present invention is to form the electrically conductive plug elements in such a way that any gaps, cracks or interstices in each plug element are effectively filled by a melted metal by way of permeation to assure a good seal between the conductive plug elements and the wall surfaces which form the through-holes, whereby the melted metal is a good electrical conductor for also assuring the required electrical contacts.

The present invention is an electrically insulating ceramic circuit board made of aluminum nitride including 1% by weight at the most, preferably less, of an oxide phase in said aluminum nitride, said board having through-holes filled with conductive plug elements passing through the through-holes in the insulating ceramic circuit board to electrically connect printed circuit conductors on both surfaces with the hole filling conductive plug elements. These circuit conductors are formed on front and rear surfaces of the insulating ceramic circuit board. Each of the hole filling conductive plug elements is made of a mixture of a metal having a high melting point and a metal containing a copper filling tightly the corresponding through-hole. The low oxide phase content in the aluminum nitride circuit board helps in the formation of a good airtight seal between the plug element and the surface forming the through-hole because a low oxide content does not interfere with the permeation of the copper into interstices of said high melting point metal. At metalizing, glass phase in AlN melt and penetrate to surface of substrate. The glass phase and copper do not wet each other, so the copper does not penetrate into the metallized layer. For the same reason the low oxide phase content assures a good and durable electrical contact between the plug element and the circuit conductors due to an effective filling of the interstices by said copper. The oxide phase is needed as an assistant for sintering the aluminum nitride board but must be limited as taught herein to assure an airtight seal.

According to another aspect of the invention, a method of manufacturing a ceramic electrically insulating circuit board having conductive plug elements passing through the board which carries electrically conducting circuits on front and rear surfaces of the board, includes the steps of:

(a) making said circuit board of aluminum nitride having a low oxide phase content of 1% by weight at the most and preferably less as a sintering assistant, (b) forming through-holes in prescribed positions of said aluminum nitride circuit board, preferably by a laser beam, (c) forming a high melting point metal layer or plug element in each of said through-holes as an electrical through-conductor, and (d) melting a permeation metal of copper or a metal containing copper and causing the resulting melted metal to permeate into interstices of the high melting point metal layer or plug element in each through-hole, whereby said low oxide phase content helps the permeation of said metal containing copper into said plug element for an improved airtight seal and improved electrical contacts between said plug elements and said circuits on both sides of the board.

The high melting point metal plug is formed by sintering a paste metal of a high melting point in each of the through-holes formed in the insulating board. The high melting point metal layer or plug element is formed in each through-hole in a state containing interstices in the form of gaps or voids. If a metal containing copper is melted to fill said interstices in the high melting point metal, such filling takes place because the melted metal permeates into the high melting point metal by capillary action. It has been found that the permeation is most effective when the aluminum nitride circuit board contains an oxide phase of less than 1% by weight at the most, presumably an oxide phase hinders the penetration of the copper or copper containing metal. Thus, keeping the oxide phase in the aluminum nitride substrate to 1% by weight or less is critical to assure an efficient permeation for two purposes, namely a good airtight seal and good electrical contacts between the plug elements and the circuit conductors on the surfaces of the circuit board. The sintering of the aluminum nitride board is still assured at this low oxide phase content. Thus, conductive plug elements are formed of the high melting point metal in which any interstices are tightly filled with copper or a copper containing metal. These conductive plugs made of the high melting point metal in which all interstices are tightly filled with the high conductive material of copper or the like, ensure a sufficient electric connection between circuits on the front and rear surfaces of the board. In addition, since the through-holes are tightly filled, airtightness between the front and rear surfaces of the board is ensured.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1A:
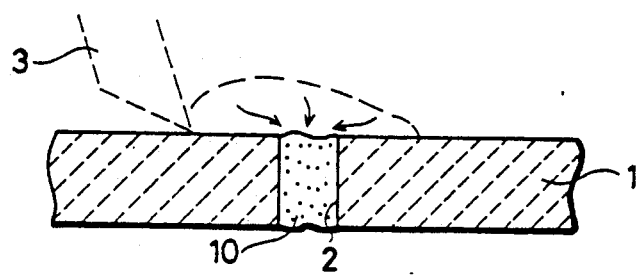
FIGS. 1A, 1B, 1C, and 1D are views showing steps of manufacturing a ceramic circuit board according to an embodiment of the invention.

Referring first to FIG. 1A, a through-hole 2 is formed in a prescribed region of an insulating board 1, preferably by a laser beam. A board of aluminum nitride (AlN) is used as the insulating board, whereby it is made certain that any oxide containing phase in the aluminum nitride board is kept to 1% by weight or less for an improved seal and for better electrical contacts while still assuring a proper sintering of the green aluminum nitride. The board of aluminum nitride is preferred since it has an excellent heat radiating property and a low reactivity with copper and it is not attacked by the permeation of copper when the latter, or a metal alloy containing copper, is melted to tightly fill the above mentioned interstices.

Figure 1B:
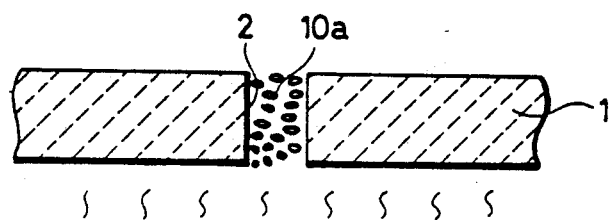
Figure 4:
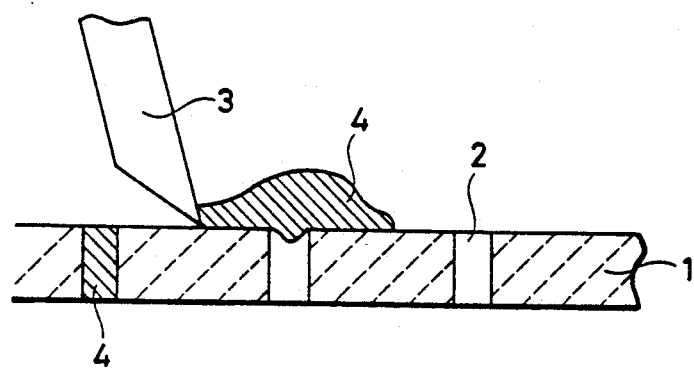
FIG. 4 is a view of a manufacturing step in a conventional method of forming conductive portions in a circuit board.
Figure 5:
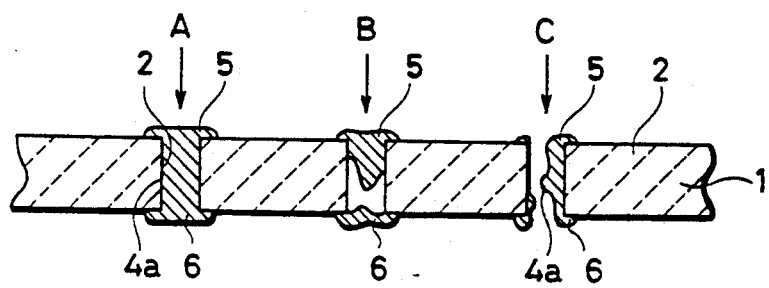
FIG. 5 is a sectional structural view of the circuit board formed by the method shown in FIG. 4.
Figure 6:
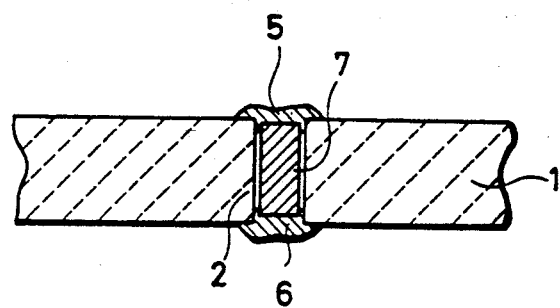
FIG. 6 is a sectional structural view of a circuit board manufactured by another conventional method.

Next, the following two methods will be described as a method for forming a high melting point metal layer or plug in the through-hole or holes. According to the first method, a non-sintered so-called green AlN sheet is perforated to form one or more through-holes 2. Thereafter, a conductive tungsten (W) paste 10 is inserted into the through-holes 2, for example, by using a rubber squeegee 3 shown in FIG. 4. The tungsten paste contains tungsten powder with powder particles having an average particle size of about 1.0 μm dispersed in a binder such as methyl cellulose. After the paste 10 has been filled into the holes 2, the AlN sheet 1 and the tungsten paste 10 are sintered at a high temperature of 1700° C. or more in an atmosphere containing $N_2$, whereby a sintered tungsten layer or plug element 10a is formed as shown in FIG. 1B in the hole or holes 2.

According to the second method, an AlN board 1 is first sintered separately and then the required through-hole or holes 2 are made and a tungsten or molybdenum (Mo) paste 10 is put into the through-hole 2 using a rubber squeegee 3. Then, a second separate sintering step is performed for sintering the tungsten or molybdenum paste 10 in a non-oxidizing atmosphere, so that a tungsten or molybdenum layer or plug element 10a is formed as shown in FIG. 1B in the respective holes.

Figure 1C:
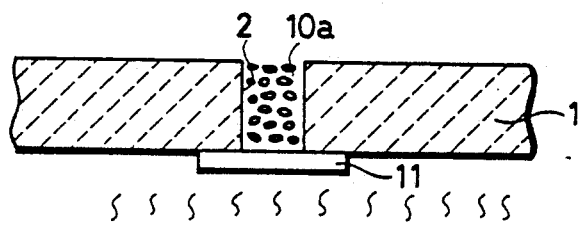
Figure 2:
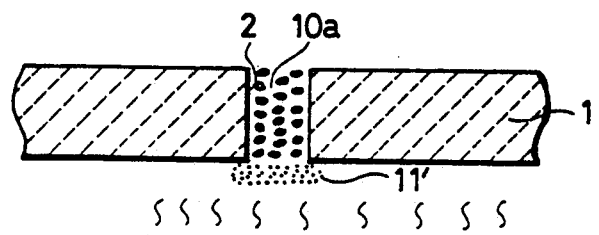
FIG. 2 is a view showing a variant of the manufacturing step shown in FIG. 1C.

The high melting point metal layer or plug element 10a contains a large number of gaps or interstices because the binder in the paste has been dissipated at the time of sintering. In addition, since it is difficult to completely fill each through-hole 2 with the conductive paste, the through-hole 2 is formed to have some gaps without being completely filled. 20% by weight, oxide phase are $Y_2O_3$, CaO, MgO etc. Referring to FIG. 1C, copper or a copper alloy 11, for example in plate form as shown in FIG. 1C, is placed on the opening on one side of the through-hole 2 so that the copper plate may be heated and melted to permeate into said interstices. Instead of a copper plate, powder 11' of copper or of a copper alloy may be used as shown in FIG. 2. The heating temperature is 1100° C. or more, or more preferably 1200° C. or more if copper is used, for melting the copper. The heating process is performed in a non-oxidizing atmosphere, and preferably in a stream of hydrogen.

Figure 1D:
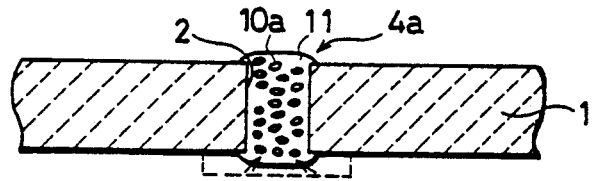

Referring to FIG. 1D, the melted copper 11 permeates into the gaps or interstices in the high melting point metal layer or plug element 10a by a capillary phenomenon and completely fills the through-hole 2. Thus, an electrically conductive plug element 4a is formed simultaneously with an airtight seal.

Figure 3:
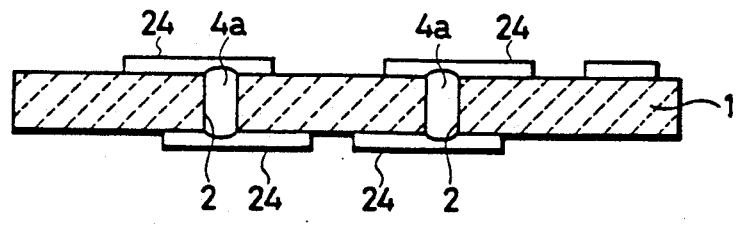
FIG. 3 is a sectional structural view through a ceramic circuit board for an integrated circuit, manufactured according to the present invention.

FIG. 3 shows an example of an integrated circuit board manufactured according to the present invention. Thin film circuits 24 are formed on front and rear surfaces of an AlN board 1.

Compact conductive plug elements 4a of tungsten (W) and copper (Cu) are formed in respective through-holes 2. The thin film circuits 24 formed on the front surface of the AlN board 1 and the thin film circuits 24 formed on the rear surface thereof are electrically connected through the conductive plug elements 4a. The AlN board is 1.0 mm in thickness and the inner diameter of each through-hole 2 is 0.1 mm. In the case of using a circuit board of such size, it would be impossible in a conventional method to assure good and complete electric connections and to maintain the required airtightness. According to the invention, the circuits on both surfaces of the circuit board exhibit good electrical connections and airtightness.

Thus, according to the present invention, after a high melting point metal layer is formed in each through-hole in an insulating board, melted copper fills gaps or interstices in the high melting point metal plug element to form the conductive plug elements for sealing the through-holes.

Six example embodiments were produced and tested as follows to determine the influence of the remainder content of an oxide containing phase in the aluminum nitride substrate. In example numbers 1, 2, 3 and 4 the aluminum nitride in its green form contained differing amounts of yttrium oxide ($Y_2O_3$) as a sintering assistant. Samples 5 and 6 contained two different amounts of calcium oxide as a sintering assistant. The amounts of the oxide containing phase of the sintering assistant are shown in the Table as follows.

TABLE

| No. | The Amount of Assistant to AlN Board | | Air Leakage | Seal Quality |
| --- | --- | --- | --- | --- |
| 1 | $Y_2O_3$ | 0.3% wt. | $<10^{-9}$ lusec | good |
| 2 | $Y_2O_3$ | 0.8% wt. | $<10^{-9}$ | good |
| 3 | $Y_2O_3$ | 2.0% wt. | high | poor |
| 4 | $Y_2O_3$ | 5.0% wt. | high | poor |
| 5 | CaO | 0.5% wt. | $<10^{-9}$ | poor |
| 6 | CaO | 10.0% wt. | high | poor |

All samples 1 to 6 were cut from an aluminum nitride sheet. Each sample had a dimension of 50 mm ×50 mm by 1.0 mm thick. A through-hole having a diameter of 0.3 mm was formed through each sample by a laser beam. Each through-hole was filled with a tungsten paste made of a tungsten powder in a binder of methyl cellulose. The tungsten powder particles had an average particle size of 1.0 μm. The samples were sintered at a temperature of 1700° C. in an $N_2H_2$-atmosphere for 30 minutes.

After completion of the sintering the samples were subjected to a process for permeating copper into any interstices that may have remained in the plug elements that were formed of the tungsten paste by the sintering. Copper platelets as shown at 11 in FIG. 1C were placed to cover the plug filled hole on one side. Then the samples were heated at a temperature of 1400° C. in an $H_2$-stream for 10 minutes for melting the copper and causing the permeation by capillary action as described above.

After completion of the permeation, each sample was tested for He-leakage by an He-leakage detector Model Nr. MSE-IIAT manufactured by SHIMAZU CORPORATION to determine the airtightness of the plug filled through-hole. The test results are also listed in the above Table.

On the one hand, it is desirable to include an oxide containing phase in the aluminum nitride to assure the desired sintering for forming the boards or substrates. For this purpose, the oxide phase in the aluminum nitride could be as high as possible. On the other hand, for the purpose of a good seal and a good electrical contact, that is for the purpose of a good permeation of an electrically conducting metal into the interstices that remain in the plug element after the sintering, the oxide containing phase must be limited as claimed herein, namely to not more than 1% by weight of the aluminum nitride.

Although the invention has been described with reference to specific example embodiments, it will be appreciated that it is intended to cover all modifications and equivalents within the scope of the appended claims.

What is claimed is:

1. A ceramic circuit board, comprising an electrically insulating substrate made of sintered aluminum nitride including up to 1% by weight of an oxide phase as a sintering assistant, said substrate having a first surface and a second surface opposite to said first surface, at least one through-hole extending from said first surface to said second surface, and an electrically conducting plug element in said through-hole, and wherein said electrically conducting plug element is made of a high melting point metal and an electrically conducting metal selected from the group consisting of copper and a copper alloy permeated into interstices in said high melting point metal, said oxide phase of up to 1% by weight at the most in said aluminum nitride substrate enhancing the formation of an airtight seal between said plug element and a surface of said through-hole for assuring an efficient permeation of said copper into interstices in said plug element made of said high melting point metal.

2. The ceramic circuit board of claim 1, wherein said high melting point metal is tungsten powder in a binder forming a paste.

3. The ceramic circuit board of claim 2, wherein said tungsten powder has an average particle size of 1.0 μm.

4. The ceramic circuit board of claim 1, wherein said electrically conducting metal is permeated into said plug element to completely fill any interstices in said plug element.

* * * * *

UNITED STATES PATENT AND TRADEMARK OFFICE
CERTIFICATE OF CORRECTION

PATENT NO.   : 5,229,549
DATED        : July 20, 1993
INVENTOR(S)  : Akira Yamakawa et al.

It is certified that error appears in the above-identified patent and that said Letters Patent is hereby corrected as shown below:

Column 6, in the Table, sample 5, last column,
        replace "poor" by --good--.

Signed and Sealed this

Twenty-second Day of February, 1994

Attest:

BRUCE LEHMAN

*Attesting Officer*   *Commissioner of Patents and Trademarks*